United States Patent [19]
Steingroever et al.

[11] Patent Number: 4,463,313
[45] Date of Patent: Jul. 31, 1984

[54] FIELD COIL FOR USE WITH POTENTIAL COIL FOR MEASURING INNER FIELD INTENSITY OF MAGNETIC MATERIAL

[76] Inventors: Erich Steingroever, Flensburger Strasse 33, 53 Bonn; Dietrich Steingroever, Bergisch-Gladbach, both of Fed. Rep. of Germany

[21] Appl. No.: 293,923

[22] Filed: Aug. 18, 1981

[30] Foreign Application Priority Data

Aug. 30, 1980 [DE] Fed. Rep. of Germany ....... 3032717

[51] Int. Cl.$^3$ ..................... G01N 27/72; G01R 33/12; G01R 33/14
[52] U.S. Cl. .................................. 324/243; 324/223; 324/227; 336/184
[58] Field of Search ............... 324/228, 222, 223, 239, 324/243, 262; 336/184, 188

[56] References Cited

U.S. PATENT DOCUMENTS 3,976,935 8/1976 Steingroever ..................... 324/243

Primary Examiner—Gerard R. Strecker
Assistant Examiner—Walter E. Snow
Attorney, Agent, or Firm—Fisher, Christen & Sabol

[57] ABSTRACT

Process and apparatus for measuring the hysteresis curves of magnetic materials when using a field coil and a potential coil of a size such that the ends of the latter coil project through the winding of the field coil. The process consists of integrating the output signal of the potential coil to obtain a first value, utilizing a voltage that is proportional to the field coil current to obtain a second value which is then added to the first value to obtain the field intensity H.

In order to compensate for the presence of the legs of the potential coil, additional short windings of higher turn density are included in the field coil winding.

5 Claims, 1 Drawing Figure

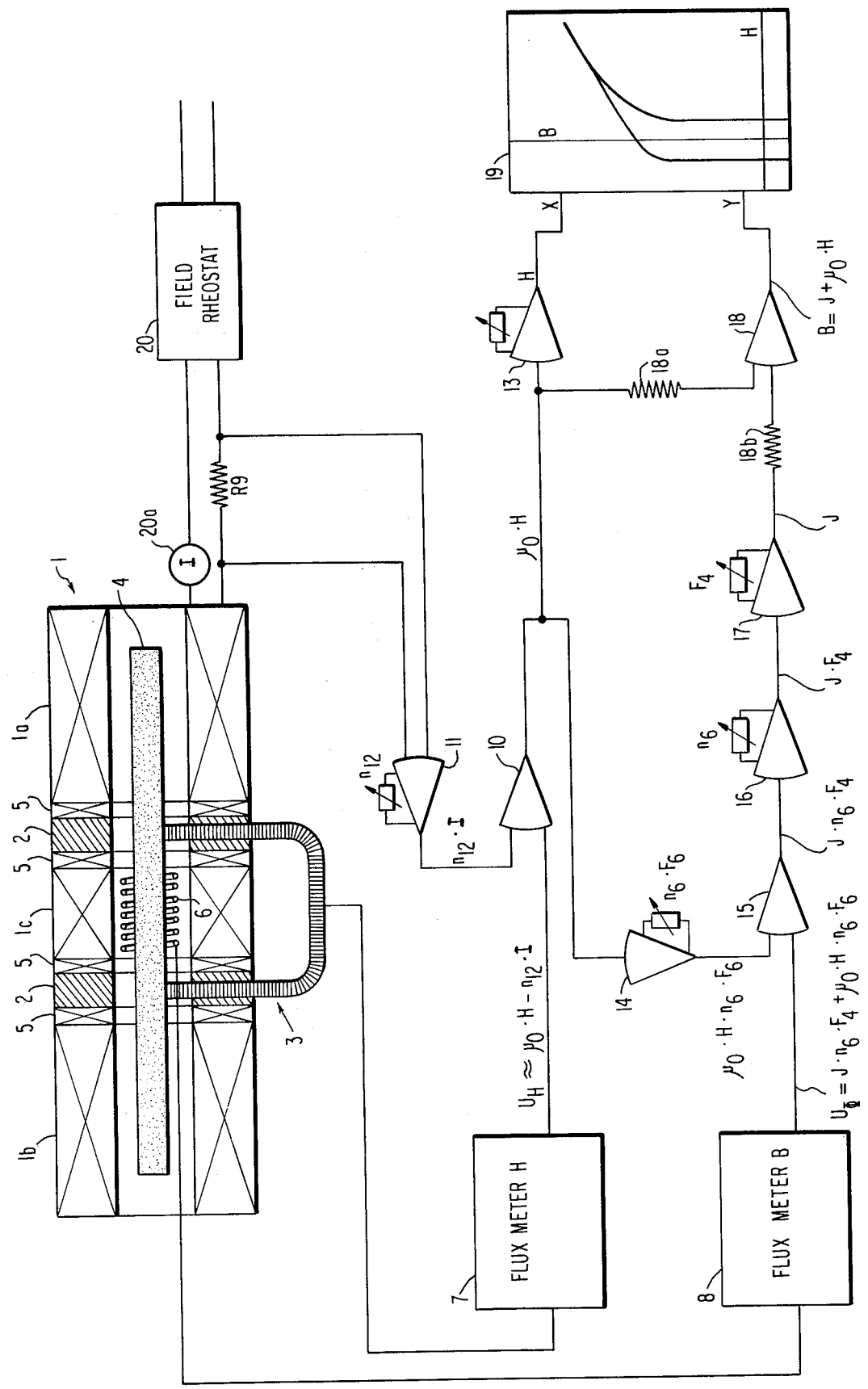

FIELD COIL FOR USE WITH POTENTIAL COIL FOR MEASURING INNER FIELD INTENSITY OF MAGNETIC MATERIAL

BACKGROUND OF THE INVENTION

1. Field of the Invention

The invention relates to a process and a field coil for the measurement of the hysteresis curves of magnetic materials. The invention is especially suited for measurements on bar- or strip-shaped specimens of soft magnetic materials, but is also applicable to permanent magnetic materials.

2. Prior Art

It is known that the hysteresis curves of such materials can be determined on test specimens in a elongated field coil. In this case the flux density, B, is measured with a coil surrounding the specimen by integration of the voltage generated by the flux change, dB/dt. The inner field intensity, H, can be calculated from the external field, H', in which the specimen is located, if the demagnetizing coefficient $D_H$, i.e., the difference between the external field, H', and the inner field H', is known. The external field, H', is determined approximately by the dimensions and the turn density of the field coil, n/l, and by the current I flowing through this coil, and is H'=n.I/l in long coils. In this known measurement process, errors occur when the test specimen and the field coil are not infinitely long, when the flux density in the specimen is high and if the length/diameter ratio of the specimen is small.

A better-known measurement of the field intensity, H, in the specimen is carried out by means of magnetic voltmeters or potential measuring coils, which are located in the inside of the field coil next to the specimen. These potential measuring coils must, however, have a relatively small cross section, because the field coil and the flux density measuring coil should enclose the test specimen as closely as possible, and therefore the potential coil can furnish only a weak test signal.

It has also been proposed that the demagnetizing coefficient in such a measuring arrangement should be measured with a potential coil, which penetrates the winding of the field coil at two points (Kohlrausch, Prakt. Physik, 1943, Vol. 2, p. 100, FIG. 64). However, it is impossible to measure the inner field intensity solely from the determination of the demagnetizing coefficient since the coefficient is not constant, and is dependent on the flux density, B. Moreover, this known measuring arrangement has the disadvantage that the winding must be interrupted twice to allow the two ends of the potential coil to pass through the winding, and accordingly a considerable error appears at these points in the field intensity of the coil.

SUMMARY OF THE INVENTION

The invention avoids the above-mentioned prior art disadvantages. The invention involves a process and a field coil for measuring the hysteresis curves of magnetic materials, and is characterized in that the inner field intensity, H, in the specimen is measured by means of a potential coil which extends through the winding of the field coil, the signal, U(t) of which potential coil is integrated to $\int Udt$, and is connected in series with a voltage that is proportional to the coil current, I.

According to the invention, a field coil intended for carrying out the described measuring process has a winding, which is interrupted at the two points where the potential coil passes through it, and which has zones of increased turn density on both sides of the points of interruption.

The invention involves a field coil for use with a potential coil for the measurement of the inner intensity H of magnetic materials. The potential coil has a medial portion disposed exteriorly of the field coil winding and a pair of terminal portions extending generally radially through the winding into the interior of the field coil at two axially spaced location. The turn density of the field coil winding is substantially uniform along most of the length thereof. An axially extending space which is free of any winding provided at the two locations to accommodate the passage through the winding of the portions of the potential coil. The turn density of a short axial length of the winding adajent the winding-free spaces is greater than that of the remainder of the length of the winding. The overall turn density of the field coil winding can be substantially the same as that of a similar coil having a uniformly spaced winding along its length. A ring of electrically insulating material can be concentrically disposed in the field coil at each of said two locations—the rings can be provided with radial apertures for the legs of the potential coil. The ratio of the turn density of $D_1$ of the short length of winding is determined by the equation:

$$D_1 = \frac{l_1 + l_2}{l_1} \times D$$

wherein: D is the turn density of the remainder of the winding; $l_1$ is the length of the window of increased turn density; and $l_2$ is the length of the winding-free space. The winding of increased turn density can be two short lenths of winding disposed at opposite ends of the winding-free space at each of the locations.

BRIEF DESCRIPTION OF THE DRAWING

In the FIGURE, there is shown, in axial cross-section a preferred form of field coil according to the invention with a schematic circuit diagram of the arrangement of components used in the process for measuring hysteresis curves according to the invention.

DETAILED DESCRIPTION OF THE INVENTION

In the drawing the field coil, indicated generally by numeral 1, is shown as having a winding which is subdivided in its axial direction into seven sections connected in series with each other. The two endmost sections 1a and 1b are each separated from the center section 1c by pairs of windings 5, of relatively short length, each pair of the these short windings, in turn flanking the opposite sides of two ring-shaped spacers 2, preferably of insulating material. Each of the spacers is provided with a radially extending aperture through which the terminal end portions of a potential coil, indicated by numeral 3, can project into the interior of field coil 1 into contact with test specimen 4, allowing the medial portion to be disposed outside of the field coil. The three principal sections 1a, 1b and 1c of the field coil are all wound with a uniform turn density n/l turns per cm, but short sections 5 thereof are wound with an increased turn density as compared to the principal sections, the purpose being to compensate for the presence of spacers 2. In this way it is possible to approximate the effect produced by a field coil of similar dimension having an uninterrupted winding of uniform turn density from one end to the other. As previously stated, all of the windings are connected in series to be supplied from a source of electrical power (not shown) through adjustable field rheostat 20 connected to the windings through resistor 9 and current meter 20a. Closely encircling test specimen 4, within the field coil, is measuring coil 6 for measuring flux density B.

Numeral 7 indicates flux meter H, which produces voltage $U_H \approx \mu_o \times H - n_{12} \times I \approx \Delta H$ at its output from voltage $U \approx dH/dt$ integrated in potential coil 3 during a change in field intensity H in the specimen, with the measuring length between the ends of the potential coil being already taken into account by corresponding measuring constant of flux meter 7, while numeral 8 indicates flux meter B, which produces voltage $U \approx J \times n_6 \times F_4 + \mu_o \times H \times n_6 \times F_6$ at its output from voltage $U \approx d\phi/dt$ flowing through it, which voltage is induced in coil 6 during a change in the flux.

At the beginning of a test, when the specimen is demagnetized and the coil field is deenergized, the values obtained will be $\Delta H = H$ and $\Delta \phi = \phi$, etc.

According to the process of the invention, voltage $U_J$, which is the voltage drop across resistor 9 and is proportional to field coil current I, is brought to the value that corresponds to the number of ampere turns, $n_{12} \times I$, covered by potential coil 3, by means of adustable amplifier 11, and this value is added to output $U_H$ of fluxmeter 7 by adding amplifier 10.

The further, known, processing of the test signals is shown in the FIGURE, where it can be seen that field intensity value H is produced at the output of adjustable amplifier 13 from output value $\mu_o \times H$ produced by amplifier 10. The output of amplifier 10 is also fed to adjustable amplifier 14, which generates a signal $\mu_o \times H \times n_6 \times F_6$ which signal is fed to substracting amplifier 15 which substracts this value from output $U\phi$ received from fluxmeter 8 to generate signal $J \times n_6 \times F_4$. From such, polarization J of the specimen is obtained by means of adjustable amplifiers 16 and 17. Finally, the adding amplifier, having its inputs connected to the outputs of amplifiers 10 and 17 by means of resistors 18a and 18b, generates an output signal for the value of flux density $B = J + \mu_o \times H$.

The values of H and B obtained respectively from the outputs of amplifiers 13 and 18 when fed to the X-Y recorder 19 can be plotted in the form of hysteresis curve B(H).

The field intensity in the field coil is disturbed by gaps 2 in field winding 1. According to the invention the disturbance is compensated in that there are zones with increased turn density n/l on both sides of the gaps, so that the overall turn density of the winding is maintained. For example, these zones combined can have a breadth equal to that of the gaps and double the turn density.

The process according to the invention can be used both to measure the static hysteresis curves and the alternating field curve of soft magnetic materials. In the latter case, the evaluation of the signals furnished by measuring coils 3 and 6 can be carried out accordingly in the known manner, e.g., also for the measurement of the power dissipation.

What is claimed is:

1. Field coil for use with a potential coil for the measurement of the inner field intensity H of magnetic materials, said potential coil having a medial portion disposed exteriorly of the field coil winding and a pair of terminal portions extending generally radially through said winding into the interior of the field coil at two axially spaced locations:

the turn density of the field coil winding being substantially uniform along most of the length thereof;

an axially extending space which is free of any winding being provided at said two locations to accommodate the passage through the winding of said portions of the potential coil;

the turn density of a short axial length of said winding adjacent said winding-free spaces being greater than that of the remainder of the length of the winding.

2. Field coil according to claim 1, wherein the overall turn density of the field coil winding is substantially the same as that of a similar coil having a uniformly spaced winding along its length.

3. Field coil according to either one of claims 1 or 2, wherein a ring of electrically insulating material is concentrically disposed in said field coil at each of said two locations, said rings being provided with radial apertures for the legs of the potential coil.

4. Field coil according to claim 3, wherein the ratio of the turn density $D_1$ of said short length of winding is determined by the equation $$D_1 = \frac{l_1 + l_2}{l_1} \times D,$$

wherein

D is the turn density of the remainder of the winding:

$l_1$ is the length of the winding of increased turn density;

$l_2$ is the length of the winding-free space.

5. Field coil according to claim 4, wherein said winding of increased turn density comprises two short lengths of winding disposed at opposite ends of the winding-free space at each of said locations.

* * * * *